United States Patent
Song et al.

[11] Patent Number: 6,159,823
[45] Date of Patent: Dec. 12, 2000

[54] TRENCH ISOLATION METHOD OF SEMICONDUCTOR DEVICE

[75] Inventors: Jong-kook Song; Han-mil Kim; Dong-ho Ahn, all of Kyungki-do, Rep. of Korea

[73] Assignee: Samsung Electronics Co., Ltd., Suwon, Rep. of Korea

[21] Appl. No.: 09/404,209

[22] Filed: Sep. 23, 1999

[30] Foreign Application Priority Data

Sep. 24, 1998 [KR] Rep. of Korea .................. 98-39723
Aug. 30, 1999 [KR] Rep. of Korea .................. 99-36331

[51] Int. Cl.[7] ................................ H01L 21/76
[52] U.S. Cl. ................................ 438/437
[58] Field of Search ............... 438/437, 445, 438/439, 424, 426

[56] References Cited

U.S. PATENT DOCUMENTS 4,561,172  12/1985  Slawinski et al. ............ 438/297
5,447,884   9/1995  Fahey et al. .
5,578,518  11/1996  Koike et al. ................ 438/424
5,677,231  10/1997  Maniar et al. .
5,863,827   1/1999  Joyner .
5,963,820  10/1999  Jeng ........................ 438/444

Primary Examiner—Olik Chaudhuri
Assistant Examiner—Anh Duy Mai
Attorney, Agent, or Firm—Jones Volentine, LLC

[57] ABSTRACT

A trench isolation method is provided that prevents the formation of a dent between a trench isolation region and an active region and prevents the generation of water spots during a cleaning process. In the trench isolation method, an undercut is formed in a stress-relief oxide pad pattern formed below a nitride layer pattern that defines an active region as a mask pattern. A nitride liner, which is a stress-buffer layer, is then formed around the undercut such that is conforms to the shape of the undercut. Thus, even though the stress-buffer layer is partially etched during the removal of the nitride the hard mask pattern, the stress-buffer layer is not etched to a position below the upper surface of the substrate. Also, an anti-reflection layer, which is the main source of water spots, is simultaneously removed in the formation of the undercut.

17 Claims, 8 Drawing Sheets

TRENCH ISOLATION METHOD OF SEMICONDUCTOR DEVICE

This application relies for priority upon Korean Patent Application Nos. 98-39723 and 99-36331, filed on Sep. 24, 1998, and Aug. 30, 1999, respectively, the contents of which are herein incorporated by reference in their entirety.

BACKGROUND OF THE INVENTION

The present invention relates to a method of manufacturing semiconductor devices, and more particularly, to a trench isolation method of a semiconductor device.

An isolation process, which is an initial step in the manufacture of a semiconductor device, is very critical because it determines the size of an active region and a process margin for the following steps. As the level of integration of semiconductor devices increases, the size allowed for an isolation region reduces, to the point where a 64M DRAM requires a 0.26 μm-technology and a 256M DRAM requires a 0.19 μm-technology.

Recently, a trench isolation method has been widely used because it allows for isolation even in a small region. In a conventional trench isolation method, as shown in FIG. 1, a pad oxide layer pattern 15 and a nitride layer pattern 20, which define an active region 12, are formed on a semiconductor substrate 10. The nitride layer pattern 20 acts as a hard mask pattern during trench etching, and the pad oxide layer pattern 15 acts to relieve the transfer of stress between the nitride layer pattern 20 and the substrate 10.

The semiconductor substrate 10 is then etched to a predetermined depth using the nitride layer pattern 20 and the pad oxide layer pattern 15 as an etching mask, resulting in the formation of a trench 23. Subsequently, a thermal oxide layer 25 is formed on the side walls of the trench 23, and a nitride liner 30 is formed on the entire surface of the resultant structure such that it conforms to the shape of the resultant structure.

The thermal oxide layer 25 serves to aid in recovering from damage that may be caused to the substrate during the etching process for forming the trench 23. The nitride liner 30 is formed so as to relieve the stress that is applied to the substrate during the following thermal process. The trench 23 is then filled with an insulation layer 35.

Referring to FIG. 2, the insulation layer 35 is then planarized by taking the upper surface of the nitride layer pattern 20 as an end point for the planarization. Then, the nitride layer pattern 20 is removed, to expose the pad oxide layer pattern 15 and to cause a trench isolation layer 35a to partially protrude above the surface of the pad oxide layer pattern 15.

In the step of removing the nitride layer pattern 20, a phosphoric acid solution is generally used. Because the nitride liner 30 is directly connected to the nitride layer pattern 20, the phosphoric acid solution, which is an etchant, can also flow through the nitride liner 30, so that the nitride liner 30 will be etched together with the nitride layer pattern 20. In addition, the nitride layer pattern 20 is generally over-etched by about 30–40% to ensure complete removal of the nitride layer pattern 20. As a result, the nitride liner 30 is etched to a point below the upper surface of the substrate 10, resulting in a first dent A between the active region 12 and the trench isolation layer 35a.

Referring to FIG. 3, trench isolation is completed by removing the pad oxide layer pattern 15. To accomplish this, the isolation layer 35a is generally etched to a predetermined depth, resulting in a modified isolation layer 35b having a height that is nearly equal to the height of the substrate 10. During this process, the entire pad oxide layer pattern 15 and a part of the isolation layer 35a are removed, forming a second dent B having a width that is wider than that of the first dent A of FIG. 2.

When the second dent B is formed, it is filled with polysilicon, which is used to form a gate, and the polysilicon remains without being removed when the gate is formed on the active region 12. As a result, the active region 12 is surrounded by the polysilicon used to form the gate, thereby concentrating an electric field on the edge of the trench isolation region. Because of this, the threshold voltage of a transistor formed on the substrate will drop. Furthermore, if the transistor has a threshold voltage that is lower than an appropriate level, the transistor can operate incorrectly at a low voltage that is not greater than an operating voltage. In addition, electric charges stored in a capacitor can be lost, and such loss of electric charge can mean the loss of data in a memory cell. Therefore, a frequent refresh operation is required, to prevent the loss of data by compensating for the lost electric charges at a predetermined interval.

Furthermore, the pad oxide layer pattern 15 and the nitride layer pattern 20, which are shown in FIG. 1, are created by forming a pad oxide layer, a nitride layer, an anti-reflection layer, and a photoresist pattern on the substrate 10 in sequence, and by etching the anti-reflection layer, the nitride layer, and the pad oxide layer in sequence using the photoresist pattern as an etching mask. After removing the photoresist pattern, the trench 23 is formed using the pad oxide layer pattern 15, the nitride layer pattern 20 and an anti-reflection layer pattern (not shown) as an etching mask.

Then, a cleaning process is performed to remove contaminants generated during the etching process. In the cleaning process, the resultant structure is processed with a mixed solution of ammonium hydroxide, hydrogen peroxide, and water (standard cleaning solution-1 (SC-1)) and then a dilute hydrogen fluoride (HF) solution. However, during such a cleaning process, water spots can be generated by the reaction between the cleaning solutions and the anti-reflection layer.

SUMMARY OF THE INVENTION

It is an object of the present invention to provide a trench isolation method for a semiconductor device that can prevent the deterioration of characteristics of a transistor caused by a dent formed between a trench isolation region and an active region. It is also an object of the present invention to provide a trench isolation method for a semiconductor device that can minimize the formation of water spots.

According to an aspect of the present invention, there is provided a trench isolation method, comprising forming a mask pattern over a semiconductor substrate to define a trench isolation region in the semiconductor substrate, the mask pattern including a stress-relief pad pattern and a hard mask pattern stacked in sequence, the stress-relief pad layer acting to relieve the transfer of stress between the hard mask pattern and the semiconductor substrate. Following this, the semiconductor substrate is etched to a predetermined depth to form a trench, using the mask pattern as an etching mask, undercutting the stress-relief pad pattern from the hard mask pattern. Then a material layer is formed on the sidewalls of the trench to allow the trench to recover from damage occurring during the etching of the semiconductor substrate, and a conformal stress-buffer layer is formed over the mask pattern and the material layer, and around the undercut such that it conforms to the shape of the undercut, the conformal stress-buffer layer acting to buffer stress applied to the substrate, filling the trench with an insulation material. After filling the trench with an insulation material, the hard mask pattern is removed. Finally, the stress-relief pad pattern is removed to complete a trench isolation region.

Preferably, the undercutting step is performed by isotropic etching using, for example, using a solution mixture containing about 0.32~2.50 wt % of hydrogen fluoride (HF) and about 17~20 wt % of ammonium fluoride (NH$_4$F) for 3 minutes or less.

In addition, the step of forming the mask pattern may comprise sequentially forming a stress-relief pad layer, a hard mask layer, and an anti-reflection layer over the semiconductor substrate. Then, a photoresist pattern is formed over the anti-reflection layer to define an active region in the semiconductor substrate, and the anti-reflection layer, the hard mask layer, and the stress-relief pad layer are sequentially etched using the photoresist pattern as an etching mask, to form the mask pattern. In addition, the undercutting step simultaneously undercuts the stress-relief pad layer and removes the anti-reflection layer.

The cleaning step may clean the resultant structure of the undercutting step using first a standard cleaning solution-1, which is a mixture of ammonium hydroxide, hydrogen peroxide and water, and then a hydrogen fluoride (HF) solution diluted with water.

The trench isolation method may further comprise rounding the upper edge of the trench after the undercutting. Preferably, the rounding is performed by hydrogen annealing at a temperature of 700° C. or higher.

Also, filling the trench with the insulation material may comprise forming a conformal first insulation material layer over the conformal stress-buffer layer, such that the conformal first insulation material layer conforms to the shape of the conformal stress-buffer layer, and fills the undercut. Then the trench is completely filled with a second insulation material. For this process, the step coverage of the first insulation material is preferably larger than the step coverage of the second insulation material.

Preferably, the stress-relief pad pattern is formed as a stacked structure including two or more layers having different etching selectivities, such that a stair-like undercut is formed in the pad pattern during the undercutting.

BRIEF DESCRIPTION OF THE DRAWINGS

The above object and advantages of the present invention will become more apparent by describing in detail preferred embodiments thereof with reference to the attached drawings in which.

DESCRIPTION OF THE PREFERRED EMBODIMENTS

Figure 1:
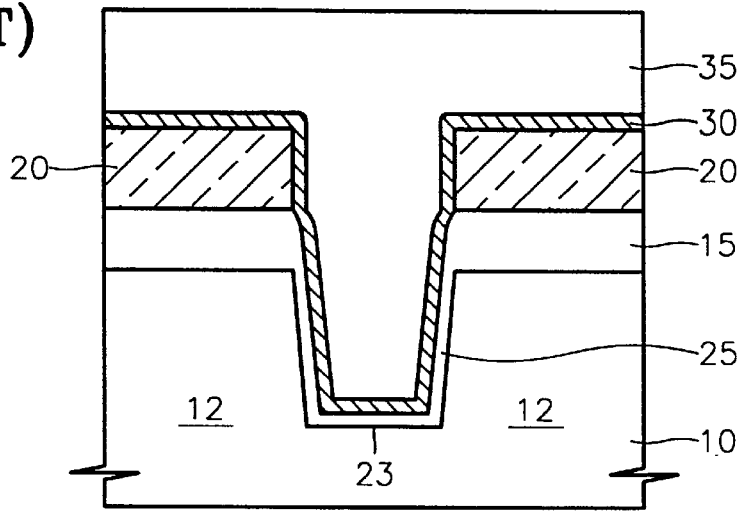
FIGS. 1 through 3 are sectional views illustrating a conventional trench isolation method.
Figure 2:
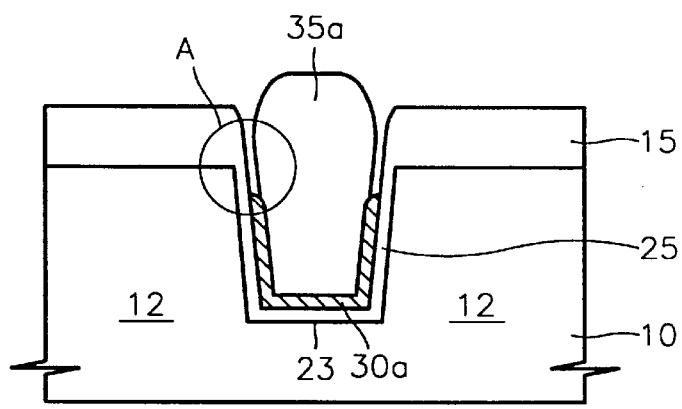
Figure 3:
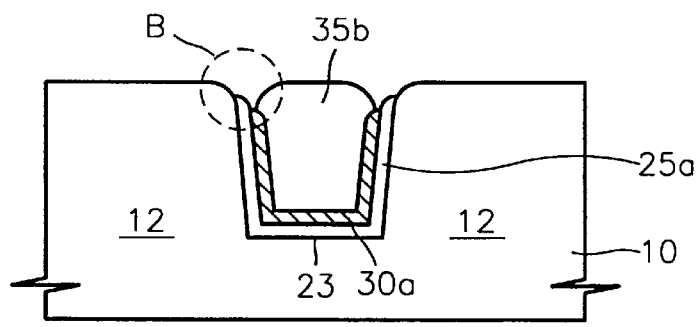

The present invention now will be described more fully with reference to the accompanying drawings, in which preferred embodiments of the invention are shown. This invention may, however, be embodied in many different forms and should not be construed as being limited to the embodiments set forth herein. Rather, these embodiments are provided so that this disclosure will be thorough and complete, and will fully convey the concept of the invention to those skilled in the art.

In the drawings, the thickness of layers and regions are exaggerated for clarity. It will also be understood that when a layer is referred to as being "on" another layer or substrate, it can be directly on the other layer or substrate, or intervening layers may also be present. The same reference numerals in different drawings represent the same element.

Figure 4:
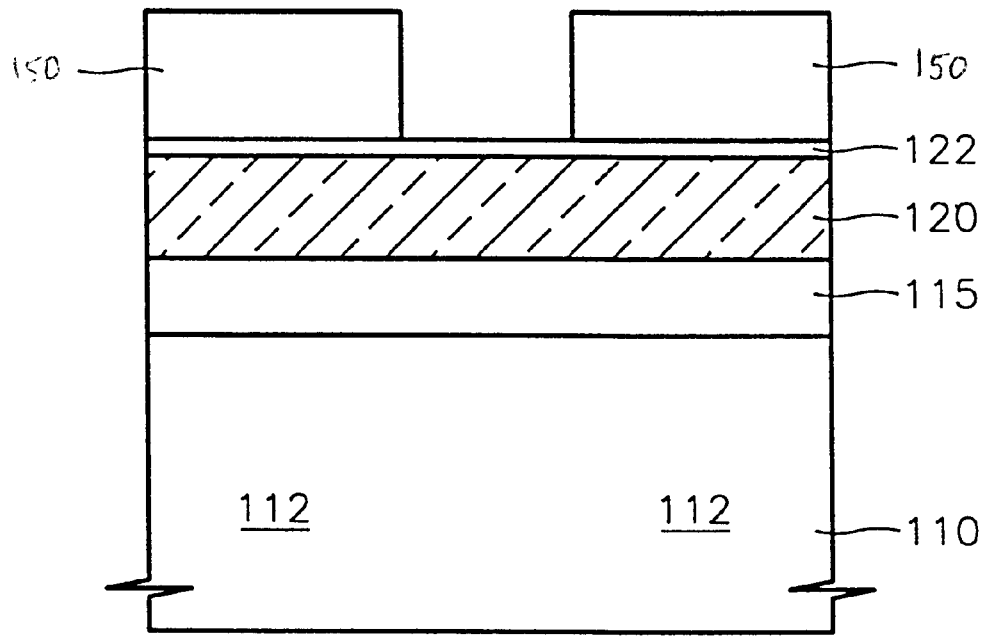
FIGS. 4 through 10 are sectional views illustrating a trench isolation method according to a first preferred embodiment of the present invention.
Figure 5:
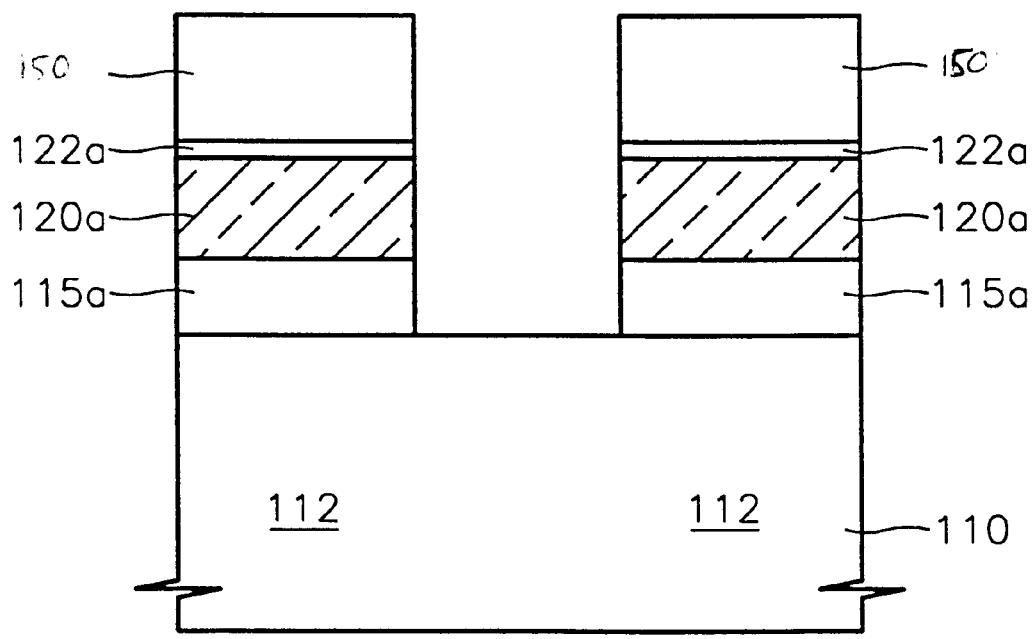
Figure 6:
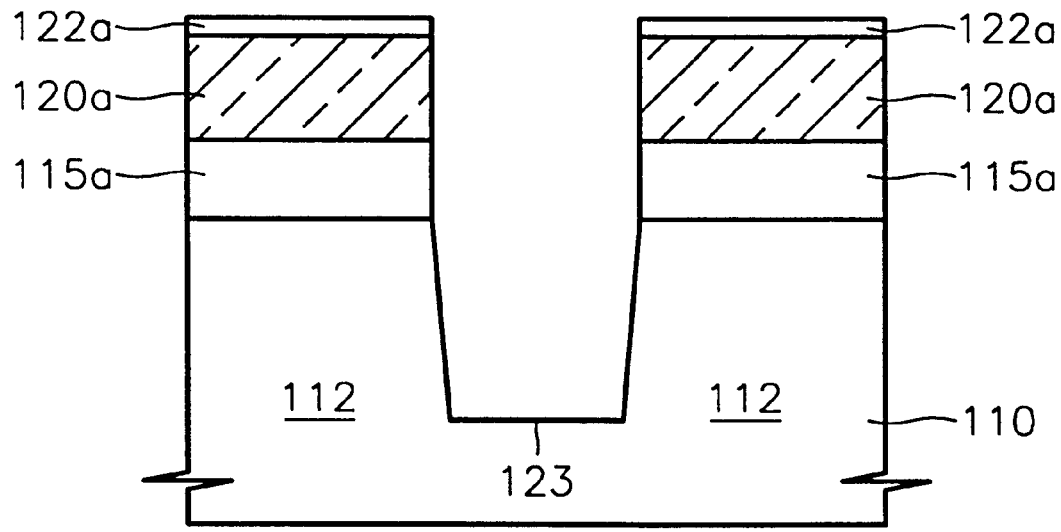

FIGS. 4 through 6 are sectional views illustrating a trench isolation method according to a first preferred embodiment of the present invention. Referring to FIG. 4, a stress-relief pad layer 115, a hard mask layer 120 and an anti-reflection layer 122 are formed in sequence on a semiconductor substrate 110. A photoresist pattern 150, which defines an active region 112, is formed on the anti-reflection layer 122, preferably by photolithography. The stress-relief pad layer 115 operates to buffer the transfer of stress between the mask layer 120 and the substrate 110. The stress-relief pad layer 115 is preferably formed as a thin oxide layer having a thickness of about 100~500 Å. The hard mask layer 120 is preferably formed as a nitride layer to a thickness of, for example, 500~3000 Å, which is thick enough to be used as an etching mask. The anti-reflection layer 122 is preferably formed of an appropriate anti-reflection material in consideration of the reflection characteristics of lower material layers. In the case where an oxide layer is used as the stress-relief pad layer 115 and a nitride layer is used as the hard mask layer 120, the anti-reflection layer 122 is preferably formed of plasma-enhanced SiON (PE-SiON) to a thickness of about 200~900 Å.

Referring to FIG. 5, the anti-reflection layer 122, the hard mask layer 120, and the stress-relief pad layer 115 are each etched in sequence using the photoresist pattern 150 as an etching mask. This etching results in an anti-reflection layer pattern 122a, a hard mask pattern 120a, and a first stress-relief pad pattern 115a.

Referring to FIG. 6, after removing the photoresist pattern 150, the substrate 110 is etched to a predetermined depth using the anti-reflection layer pattern 122a, the hard mask pattern 120a, and the first stress-relief pad pattern 115a as an etching mask, to form a trench 123. Preferably, the trench is formed by drying etching. The depth of the trench 123 is determined based on the required degree of isolation. In general, the trench 123 is formed to a depth of about 300~10000 Å.

Figure 7:
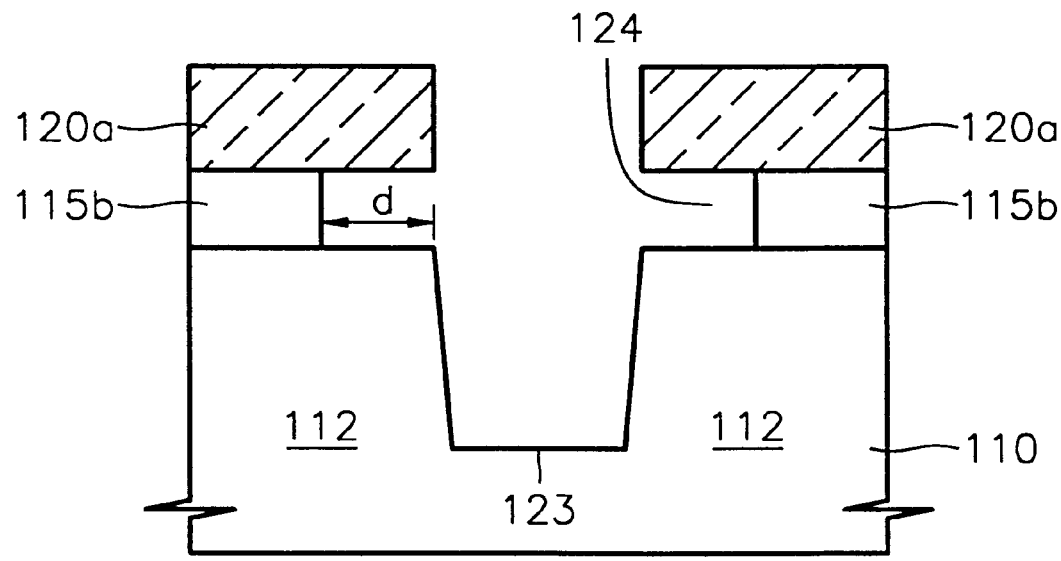

Referring to FIG. 7, a second stress-relief pad pattern 115b is formed by undercutting the first stress-relief pad pattern 115a from the hard mask pattern 120a. The distance "d" of an undercut 124 is determined based on the etching rate of a stress-buffer layer (130 in FIG. 8) to be formed in the following process. In other words, the first stress-relief pad pattern 115a is undercut by an amount that will provide a detour that can prevent the stress-buffer layer 130 from being etched to below the upper surface of the substrate 110.

In addition, it is preferable that the anti-reflection layer 122a (see FIG. 6) is simultaneously removed during the undercutting. Thus, the distance "d" of the undercut may also be related to the thickness of the anti-reflection layer 122a to be removed. In general, the anti-reflection layer is formed to a thickness of about 200~900 Å, and thus it is suitable for the distance "d" of the undercut to be about 300~600 Å. The undercutting is preferably performed by isotropic etching.

Preferably, a mixture of about 0.32~2.50 wt % of hydrogen fluoride (HF) and about 17~20 wt % of ammonium fluoride ($NH_4F$) is used for the undercutting process. The etching rate of the mixture is preferably about 100~200 Å/min. It is preferable that the undercutting process be performed for 3 minutes or less.

After the undercutting, the substrate is then cleaned to remove any contaminants generated during the etching of the trench 123. The cleaning step is preferably performed using SC-1, which is a mixture of ammonium hydroxide, hydrogen peroxide, and water, and then a dilute HF solution. Preferably, the SC-1 solution is used at a temperature of 70° C. or less for about 3~20 minutes. The dilute HF solution is preferably a mixture of hydrogen fluoride and deionized water in a ratio of about 1:200. The processing time using the dilute HF solution is preferably about 10~150 seconds.

Because the anti-reflection layer pattern 122a is removed during the undercutting process, water spots are not generated even though the cleaning process is later performed.

Figure 8:
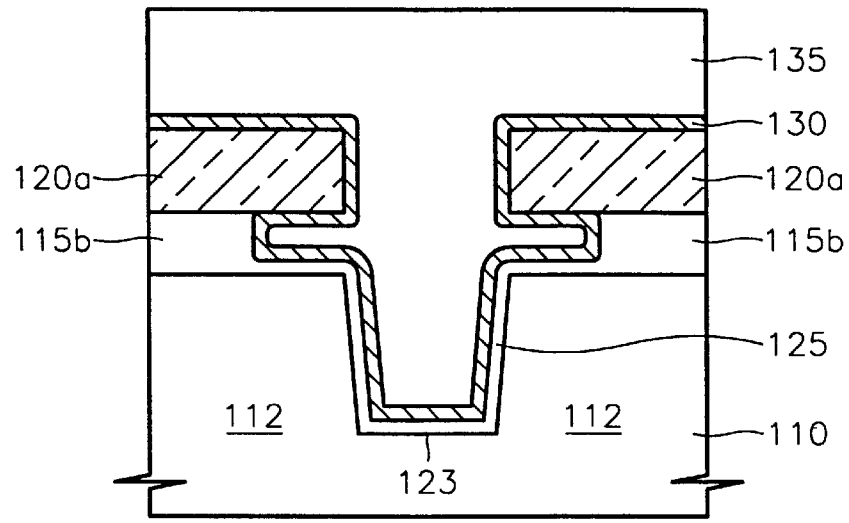

Referring to FIG. 8, a material layer 125 is then formed to recover the damage to the semiconductor substrate 110, which was caused during the dry etching process performed to form the trench 123. In general, because damage to a semiconductor substrate is recovered by a thermal process, a thermal oxide layer is formed as the material layer 125. The thermal oxide layer 125 recovers the damage of the substrate 110 and maintains the surface of the substrate 110 to be in a stable bonding (Si—$O_2$) state. This acts to prevent leakage current through the surface of the trench. The thickness of the thermal oxide layer 125 can be adjusted to a suitable level based on, for example, the width of the trench 123.

A stress-buffer layer 130 is formed on the entire surface of the structure having the thermal oxide layer 125. In particular, the stress-buffer layer 130 is formed around the undercut 124 such that it conforms to the shape of the undercut 124.

An insulating layer is then formed over the stress-buffer layer 130 and in the trench 123. After filling the trench 123 with an insulation layer 135, a thermal process is performed to densify the insulation layer 135. The thermal process is preferably performed at a temperature of about 700~1200° C. for several minutes to several hours. Most preferably it is performed for about 1 hour.

Because the coefficients of thermal expansion between the semiconductor substrate 110 and the insulation layer 135 are different, stress is applied to the semiconductor substrate 110 during the thermal process used to density the insulation layer, potentially causing crystalline defects or dislocations in the semiconductor substrate 110. The stress-buffer layer 130 is formed to prevent such crystalline defects or the generation of dislocations in the semiconductor substrate 110. The crystalline defects or dislocations can cause leakage current and so are preferably avoided.

Even though the thermal oxide layer 125 is formed at the sidewalls of the trench 123, the thermal oxide layer 125 is not sufficient to relieve the semiconductor substrate 110 from stress. To overcome such limitation, the stress-buffer layer 130 is formed on the thermal oxide layer 125. The stress-buffer layer 130 is preferably a nitride liner formed by low pressure chemical vapor deposition (LPCVD). The thickness of the stress-buffer layer 130 is determined taking into account the degree of oxidation of the stress-buffer layer 130 during a subsequent thermal process and its etching rate during a subsequent hard mask pattern removing process. In the case where the stress-buffer layer 130 is formed as a nitride liner, the thickness of the stress-buffer layer 130 is preferably about 20~150 Å, and more preferably about 40~70 Å.

The insulation layer 135 is preferably formed of a material that has a high fluidity, to allow the trench 123 to be easily filled. For example, undoped silicate glass (USG) or spin on glass (SOG) may be used.

Figure 9:
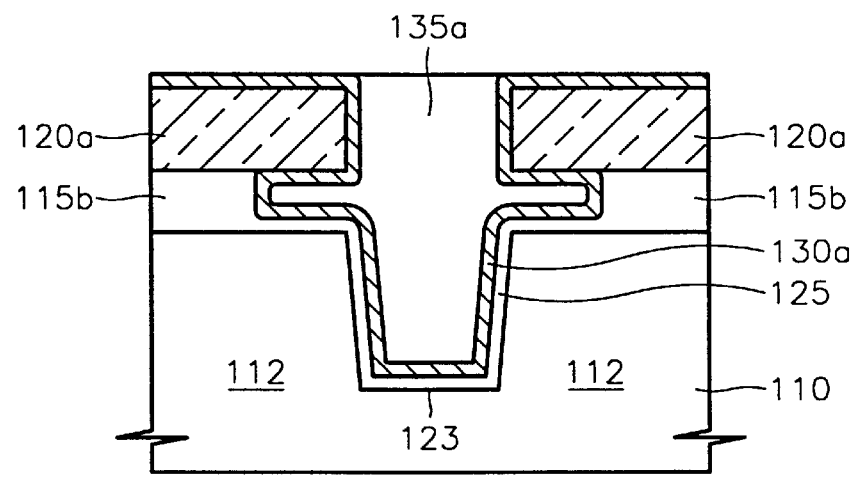

Referring to FIG. 9, the insulation layer 135 is planarized using the upper surface of the hard mask pattern 120a as an end point of the planatization, resulting in the formation of an isolation layer 135a. The planarization is preferably performed by a chemical mechanical polishing (CMP) process or an etch-back process.

Figure 10:
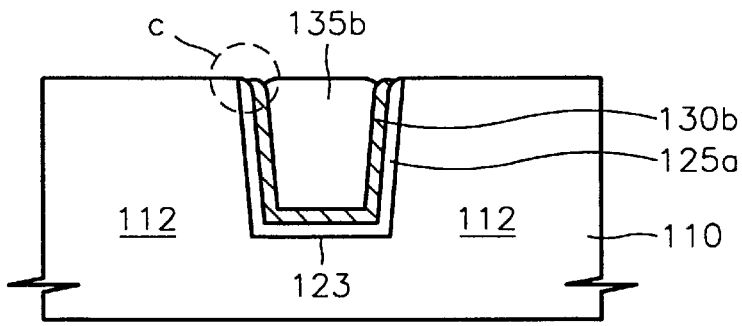

Referring to FIG. 10, the hard mask pattern 120a is then removed, preferably using a phosphoric acid solution. The hard mask pattern 120a is preferably over-etched by about 30~40%, so that it will be completely removed. However, the stress-buffer layer 130 is formed around the undercut 124 such that it conforms to the shape of the undercut 124 (see FIG. 9). As a result of this, the etching path of the stress-buffer layer 130 is longer than that of a conventional stress-buffer layer. This means that even when over etching is performed to remove the hard mask pattern 120a, the stress-buffer layer 130a is not etched to below the substrate 110, as indicated by a circle "C". In other words, a dent is not formed between an isolation region and an active region, unlike in the conventional method.

After the hard mask pattern 120a is removed, the stress-relief pad pattern 115b is then also removed, preferably by a general etching process. At this time, the isolation layer 135a is partially etched, resulting in a final isolation layer 135b that is preferably flush with the level of the substrate 110.

In the first preferred embodiment, after forming the undercut in the stress-relief pad pattern, the stress-buffer layer 130 is formed around the sides of the undercut 124, such that it conforms to the shape of the undercut 124 and the path of the stress-buffer layer 130 goes around the undercut 124. Thus, the length of the stress-buffer layer 130 that will be etched when removing the hard mask pattern 120a is extended. As a result, the formation of a dent between the trench isolation region and the active region, which is caused when a stress-buffer layer formed below the upper surface of the substrate is etched, can be effectively prevented. In addition, the anti-reflection layer 122, which is the main reason for the formation of water spots, is also removed during the formation of the undercut. As a result of this, the formation of water spots and the associated failure due to the generation of such water spots can be prevented.

An isolation method according to a second preferred embodiment of the present invention is illustrated in FIGS.

Figure 11:
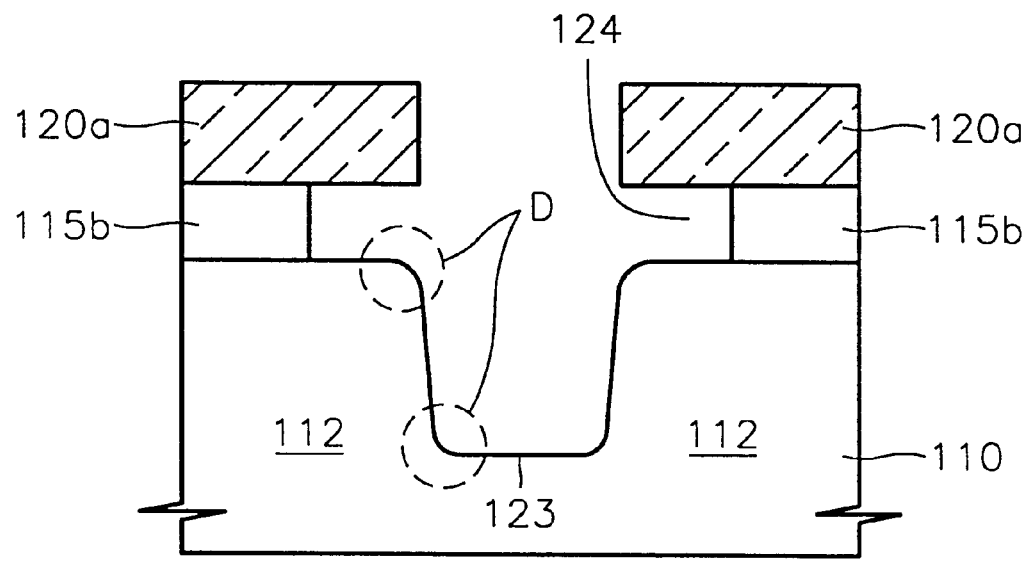
FIGS. 11 through 12 are sectional views illustrating a trench isolation method according to a second preferred embodiment of the present invention.

11 and 12. Referring to FIG. 11, the second preferred embodiment differs from the first preferred embodiment in that it further includes a step of rounding the upper edge of the trench, as indicated by circles labeled "D".

The process up to the formation of the undercut 124 is performed in the same manner as in the first preferred embodiment, and then the resultant structure, which has the undercut 124, is hydrogen annealed at a temperature of 700° C. or higher under a pressure of $10^{-3}$ Torr or more, preferably $10^3$ Torr or more. The annealing process causes the surface migration of silicon atoms in the semiconductor substrate 110, which rounds the upper edge and corners of the trench as indicated by the circles labeled "D".

Figure 12:
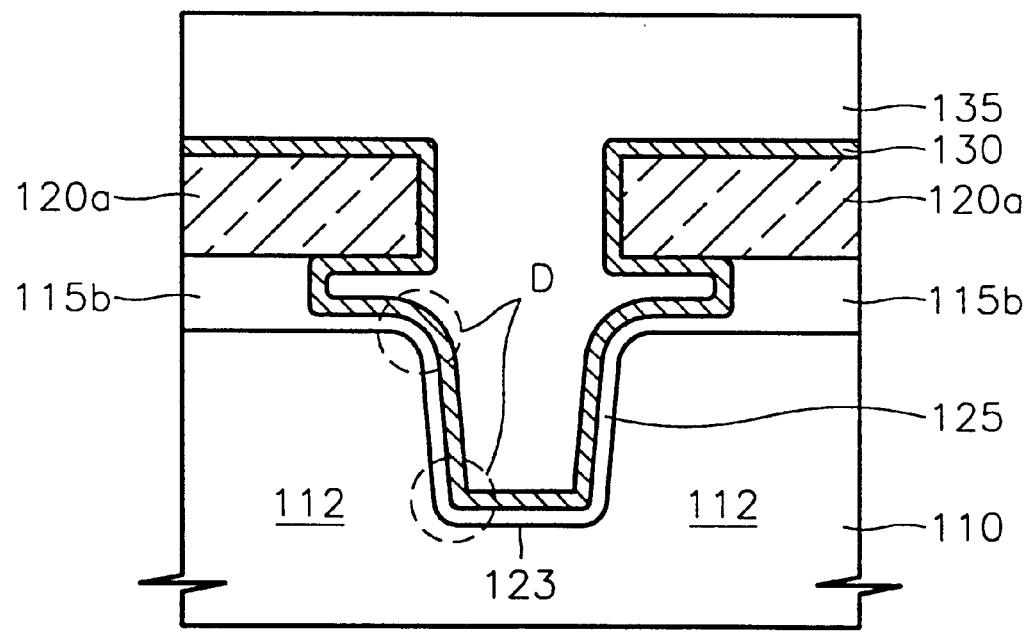

Referring to FIG. 12, the thermal oxide layer 125 which recovers the damage of the trench done by etching, the stress-buffer layer 130, and the insulation layer 135 filling the trench may all be formed in the same manner as in the first preferred embodiment.

Because the upper corner of the trench 123 is round, however, the thermal oxide layer 125 and the stress-buffer layer 130 are formed having a rounded shape at the edge of the trench 123. As a result of this, the electric field strength at the upper edge of the trench, which is induced by a gate voltage, is decreased, which in turn has the effect of increasing the threshold voltage $V_T$ of a parasitic transistor that is intrinsically formed at the upper edge of the trench. Also, the thinning of a gate oxide layer formed in the following step is suppressed, thereby improving the reliability of the gate oxide layer.

The remaining steps are the performed in the same manner as in the first preferred embodiment, thereby completing a trench isolation region.

Figure 13:
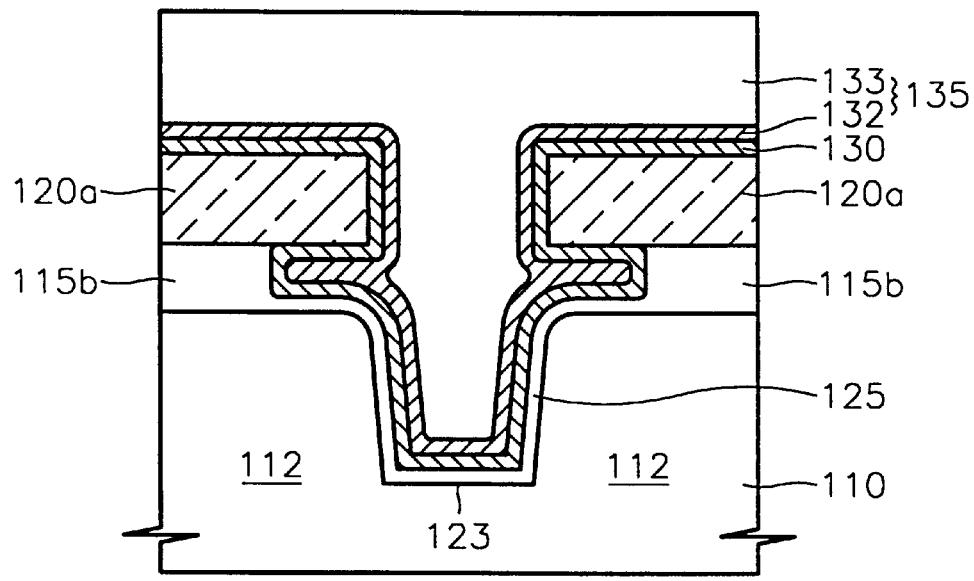
FIG. 13 is a sectional view illustrating a trench isolation method according to a third preferred embodiment of the present invention.

FIG. 13 illustrates a trench isolation method according to a third preferred embodiment of the present invention. In the third preferred embodiment, the trench is filled with at least two different material layers unlike in the first embodiment where the trench is filled with only one material layer.

First, the undercut 124 is filled with a first material layer 132, and then the remaining part of the trench is completely filled with a second material layer 133. Preferably, the first material layer 132 comprises a material that allows the first material layer 132 to be formed around the stress-buffer layer 130 and to easily conform to the shape of the undercut 124, which has a shape that is difficult to fill, so that the undercut 124 will be easily filled. Thus, the first material is preferably formed of a material having a higher step coverage than that of the second material. For example, the first material layer 132 may be formed of high temperature oxide (HTO), and the second material layer 133 may be formed of undoped silicate glass (USG) or high density plasma oxide (HDP-oxide).

Figure 14:
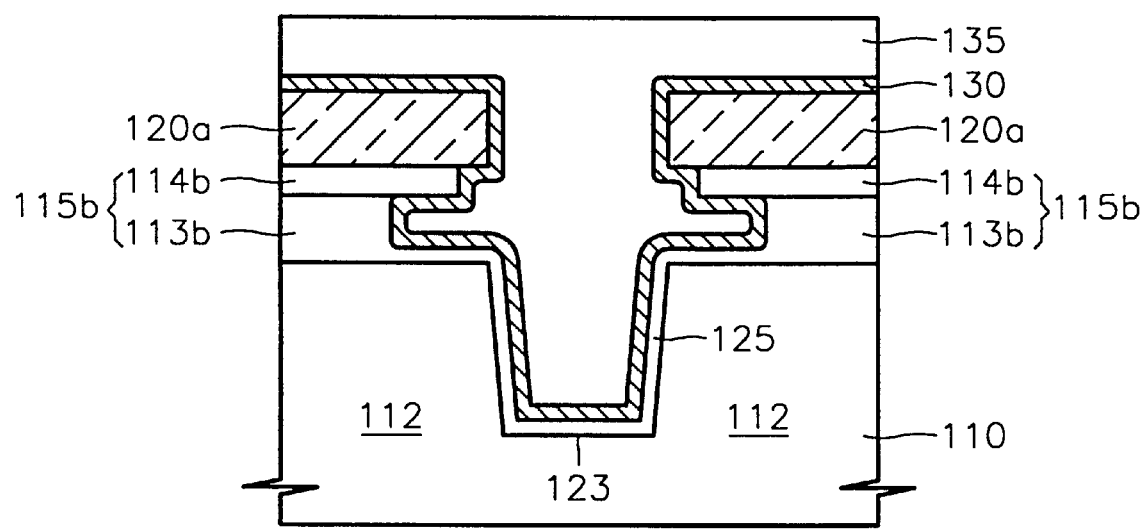
FIGS. 14 and 15 are sectional views illustrating a trench isolation method according to a fourth preferred embodiment of the present invention.
Figure 15:
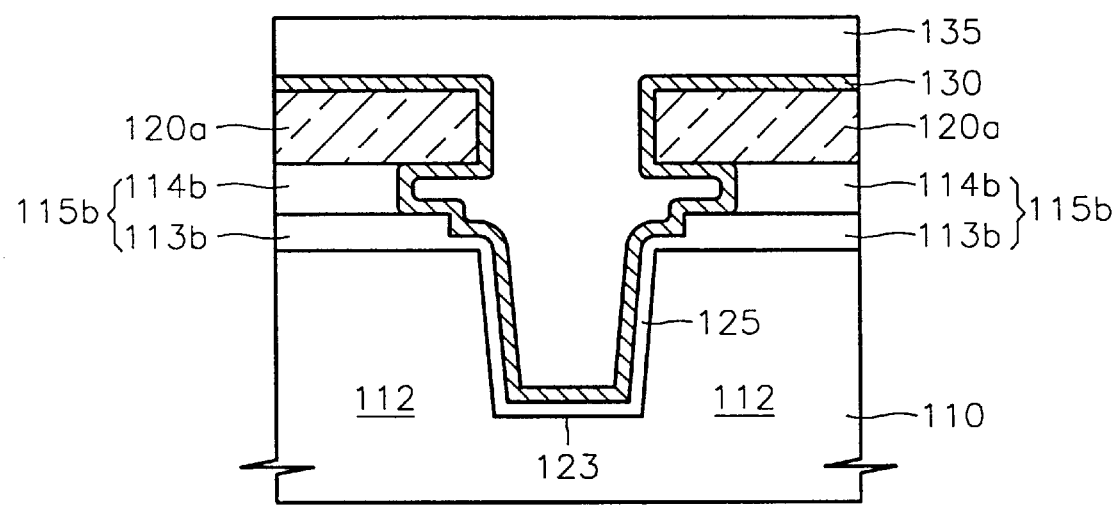

FIGS. 14 and 15 illustrate a trench isolation method according to a fourth preferred embodiment of the present invention. In the fourth preferred embodiment, the second stress-relief pad pattern 115b, in which the undercut is formed, comprises a stacked structure including two or more layers having different etching selectivities. As a result, a stair-like undercut is formed in the second stress-relief pad pattern 115b.

FIG. 14 shows a case where a first lower pad pattern 113b has a large etching selectivity with respect to a first upper pad pattern 114b, and FIG. 15 shows a case where a second lower pad pattern 113b has a small etching selectivity with respect to a second upper pad pattern 114b.

The material having a large etching selectivity may be chemical vapor deposition oxide (CVD-oxide) or plasma enhanced oxide (PE-oxide), while the material having a small etching selectivity may be high temperature oxide (HTO) or high density plasma oxide (HDP).

After forming the stress-relief pad pattern as the stacked structure including two or more layers having different etching selectivity, the stress-relief pad pattern is undercut, thus forming the second stress-relief pad pattern 115b into a stair-like shape. Because of the presence of the stair-like shape, the path of the stress-buffer layer 130 becomes even longer than without the stair-like shape. As a result of this, the etching of the stress-buffer layer 130 below the upper surface of the substrate can more effectively be prevented when the hard mask pattern 120a is removed.

The present invention will be described in detail with reference to the following experimental examples. However, these examples are merely illustrative and the present invention is not limited to those examples.

EXPERIMENTAL EXAMPLE 1

Measurement of Threshold Voltage of Transistor

Experimental groups were prepared by the trench isolation method according to a preferred embodiment of the present invention. Firstly, a pad oxide layer, a nitride layer, and a PE-SiON layer, which acts as an anti-reflection layer, were sequentially formed on a semiconductor substrate to a thickness of 160 Å, 1460 Å, and 600 Å, respectively. Then, a photoresist layer was deposited on the anti-reflection layer and patterned to form a photoresist pattern. The PE-SiON layer, the nitride layer, and the pad oxide layer were sequentially etched using the photoresist pattern as an etching mask, resulting in a hard mask pattern. The hard mask pattern defined a plurality of trenches and each trench had a width of 2100 Å. After removing the photoresist pattern by ashing and stripping processes, the substrate was etched to a depth of 2600 Å, using the hard mask pattern as an etching mask. This process resulted in the formation of a plurality of trenches.

The resulting structure was initially processed for 180 seconds using an LAL200 solution, which comprises HF and $NH_4F$, and has an etching rate of 200 Å/min for a thermal oxide layer, to achieve undercutting. Then the structure was processed using SC-1 solution for 10 minutes. Finally, the structure was processed for 90 seconds using a dilute HF solution which contains HF and deionized water in a ratio of 1:200, to clean the resultant structure.

A thermal oxide layer was then formed on the sidewalls of the trench to a thickness of 110 Å and a nitride liner was formed to a thickness of 60 Å. After filling the trench with USG, the resultant structure was planarized by CMP and processed using a phosphoric acid solution to remove the nitride layer pattern of which the hard mask pattern was made. Finally, the resultant structure was processed using an HF solution to remove the pad oxide layer pattern, thereby completing a trench isolation region.

A gate oxide layer and a gate electrode were formed in sequence on each of the plurality of active regions defined by the trench isolation regions, and doped with impurities to define a source/drain region. Then, the threshold voltage of each of the completed transistors was measured at ten different positions on the substrate.

Control groups 1 and 2 were prepared in the same manner as in the above, except for undercutting the pad oxide layer. After the trench were formed, the control group 1 was cleaned using the SC-1 solution at 70° C. for 10 minutes and then an HF solution, which was diluted in a ratio of 200:1, for 180 seconds, before formation of the thermal oxide layer. The control group 2 was cleaned using the HF solution, which was diluted in a ratio of 200:1, for 180 seconds, and then the SC-1 solution at 70° C. for 10 minutes. The threshold voltage of transistors of the control groups 1 and 2 were measured in the same manner as above.

Figure 16:
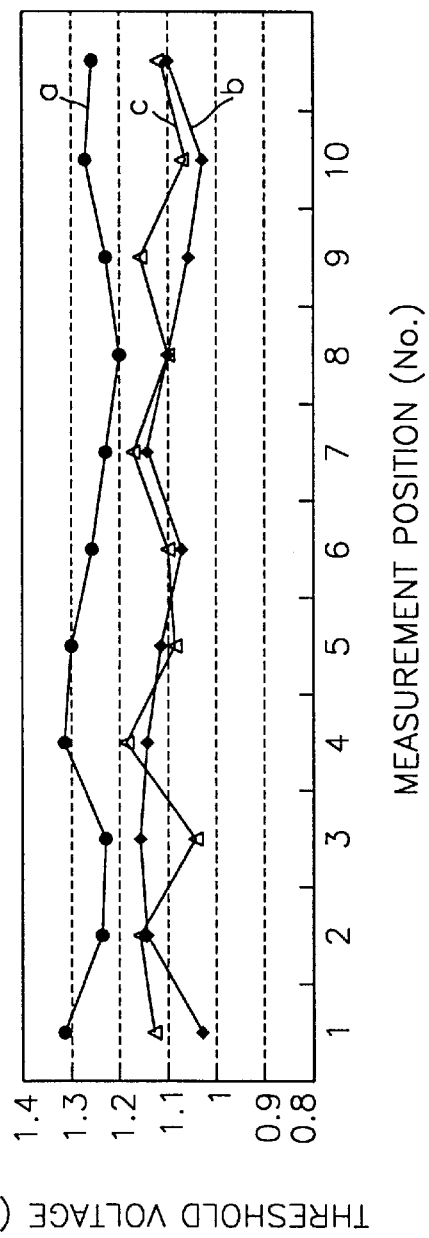
FIG. 16 is a graph comparatively showing the threshold voltage of a cell transistor formed in an active region defined by the trench isolation method according to the present invention, and the threshold voltage of a cell transistor formed in an active region defined by a conventional trench isolation method.

The results are shown in FIG. 16. A graph "a" indicates the threshold voltage of the experimental group, and graphs "b" and "c" indicate the threshold voltage of the control groups 1 and 2, respectively. As can be seen from FIG. 16, the threshold voltage of the transistor formed by the method according to a preferred embodiment of the present invention (indicated by "a") is much higher than those of the transistors formed by the conventional method (indicated by "b" and "c").

EXPERIMENTAL EXAMPLE 2

Measurement of Drain Current of Transistor

Figure 17:
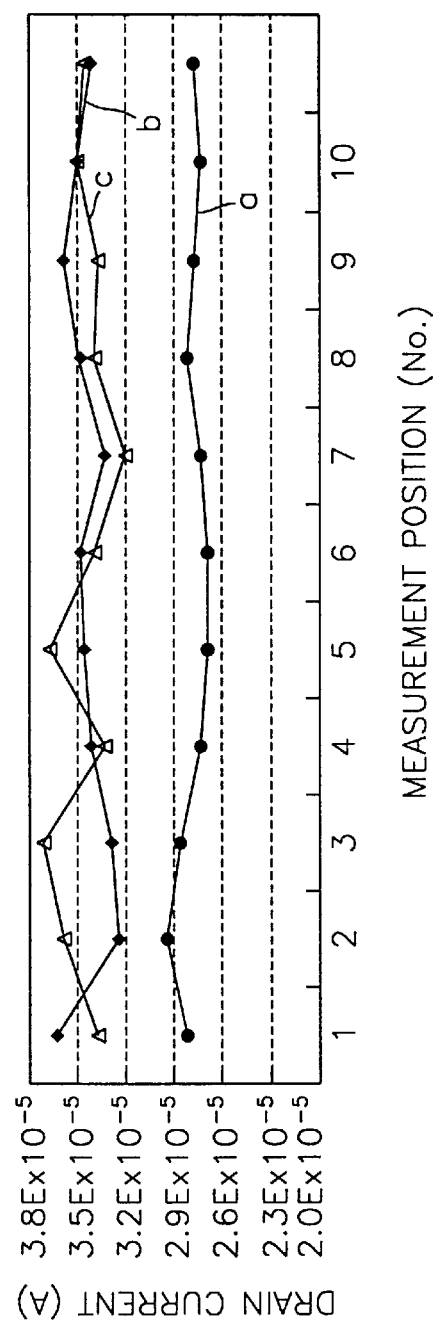
FIG. 17 is a graph comparatively showing the drain current of a cell transistor formed in an active region defined by the trench isolation method according to the present invention, and the threshold voltage of a cell transistor formed in an active region defined by a conventional trench isolation method.

The drain current was measured for transistors of the experimental group and the control groups 1 and 2 which were prepared in Experimental Example 1. The result is shown in FIG. 17. In FIG. 17, a graph "a" indicates the drain current of the experimental group, and graphs "b" and "c" indicate the drain current of the control groups 1 and 2, respectively.

As can be seen in FIG. 17, the drain current of the transistor formed by the method according to a preferred embodiment of the present invention (indicated by "a") is lower than those of the transistors formed by the conventional methods (indicated by "b" and "c")

EXPERIMENTAL EXAMPLE 3

Measurement of Density of Water Spots

After the cleaning process was performed on the experimental group and the control groups 1 and 2 that were prepared in Experimental Example 1, the number of occurrences of water spots were measured before a thermal oxide layer was formed on the sidewalls of the trench. The result is shown in TABLE 1.

TABLE 1

| Group | Total number of contaminant particles | Number of water spots | Density of water spots (number of spots/cm$^2$) |
| --- | --- | --- | --- |
| Experimental group | 13 | 0 | 0 |
| Control group 1 | 993 | 910 | 8.46 |
| Control group 2 | 54 | 43 | 0.40 |

From TABLE 1, it can be understood that the present invention essentially prevents the occurrence of defects due to water spots.

In the trench isolation method according to the present invention, an undercut is formed in a stress-relief oxide pad pattern, which is itself formed below a nitride hard mask pattern to relieve the transfer of stress between a hard mask pattern and a substrate. Then, in order to minimize the stress to be applied to the substrate during the thermal process on a trench filling material, a stress-buffer layer is formed around the undercut such that it conforms to the shape of the undercut and the path of the stress-buffer layer goes around the undercut. As a result of this, the formation of a dent between a trench isolation region and an active region, caused by excessive etching of the stress-buffer layer in the removal of the hard mask pattern, can be effectively prevented. This can prevent a drop in the threshold voltage of a transistor formed in the active region, caused by the dent formed between the trench isolation region and the active region. Also, the anti-reflection layer can be removed during the formation of the undercut, to solve the problem of water spots being formed during the cleaning process performed after etching the trench.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A trench isolation method, comprising:

forming a mask pattern over a semiconductor substrate to define a trench isolation region in the semiconductor substrate, the mask pattern including a stress-relief pad pattern and a hard mask pattern stacked in sequence, the stress-relief pad layer acting to relieve the transfer of stress between the hard mask pattern and the semiconductor substrate;

etching the semiconductor substrate to a predetermined depth to form a trench, using the mask pattern as an etching mask;

undercutting the stress-relief pad pattern from the hard mask pattern;

forming a material layer on the sidewalls of the trench to allow the trench to recover from damage occurring during the etching of the semiconductor substrate;

forming a conformal stress-buffer layer over the mask pattern and the material layer, and around the undercut such that it conforms to the shape of the undercut, the conformal stress-buffer layer acting to buffer stress applied to the substrate;

filling the trench with an insulation material;

removing the hard mask pattern; and removing the stress-relief pad pattern to complete a trench isolation region.

2. A trench isolation method, as recited in claim 1, wherein the stress-relief pad pattern comprises an oxide, and the hard mask pattern and the stress-buffer layer comprise a nitride.

3. A trench isolation method, as recited in claim 1, wherein the undercutting is performed by isotropic etching.

4. A trench isolation method, as recited in claim 3, wherein the undercutting is performed using a solution mixture containing 0.32~2.50 wt % of hydrogen fluoride (HF) and 17~20 wt % of ammonium fluoride (NH$_4$F).

5. A trench isolation method, as recited in claim 4, wherein the undercutting is performed for 3 minutes or less.

6. A trench isolation method, as recited in claim 1, wherein the step of forming the mask pattern further comprises:

sequentially forming a stress-relief pad layer, a hard mask layer, and an anti-reflection layer over a semiconductor substrate;

forming a photoresist pattern over the anti-reflection layer to define an active region in the anti-reflection layer; and etching the anti-reflection layer, the hard mask layer, and the stress-relief pad layer in sequence using the photoresist pattern as an etching mask, to form the mask pattern.

7. A trench isolation method, as recited in claim 6, wherein the undercutting step undercuts the stress-relief pad layer and simultaneously removes the anti-reflection layer.

8. A trench isolation method, as recited in claim 6, wherein the undercutting step is performed using a solution mixture containing about 0.32~2.50 wt % of hydrogen fluoride (HF) and about 17~20 wt % of ammonium fluoride ($NH_4F$).

9. A trench isolation method, as recited in claim 8, wherein the undercutting is performed for 3 minutes or less.

10. A trench isolation method, as recited in claim 6, further comprising cleaning the substrate after the undercutting step.

11. A trench isolation method, as recited in claim 10, wherein the cleaning step comprises:

performing a first processing of the mask pattern and the semiconductor substrate using a standard cleaning solution-1, which comprises ammonium hydroxide, hydrogen peroxide, and water; and performing a second processing of the mask pattern and semiconductor substrate using a hydrogen fluoride (HF) solution diluted with water after the cleaning using the standard cleaning solution-1.

12. A trench isolation method, as recited in claim 11, wherein the first processing of the mask pattern and the semiconductor substrate is performed for about 3~20 minutes.

13. A trench isolation method, as recited in claim 11, wherein the second processing of the mask pattern and the semiconductor substrate is performed for about 10~150 seconds.

14. A trench isolation method, as recited in claim 1, further comprising rounding the upper edge of the trench, after the undercutting step.

15. A trench isolation method, as recited in claim 14, wherein the rounding is performed by hydrogen annealing at a temperature of 700° C. or higher.

16. A trench isolation method, as recited in claim 1, wherein filling the trench with the insulation material comprises:

forming a conformal first insulation material layer over the conformal stress-buffer layer, such that the conformal first insulation material layer conforms to the shape of the conformal stress-buffer layer, and fills the undercut; and filling the trench completely with a second insulation material, wherein the step coverage of the first insulation material is larger than the step coverage of the second insulation material.

17. A trench isolation method, as recited in claim 1, wherein the stress-relief pad pattern is formed as a stacked structure including two or more layers having different etching selectivities, such that a stair-like undercut is formed in the pad pattern during the undercutting.

* * * * *